United States Patent
Lee

[11] Patent Number: 6,136,675
[45] Date of Patent: Oct. 24, 2000

[54] METHOD FOR FORMING GATE TERMINAL

[75] Inventor: Claymens Lee, Fengshan, Taiwan

[73] Assignee: United Semiconductor Corp, Hsinchu, Taiwan

[21] Appl. No.: 09/313,167

[22] Filed: May 17, 1999

[30] Foreign Application Priority Data

May 3, 1999 [TW] Taiwan ................................. 88107124

[51] Int. Cl.$^7$ ................... H01L 21/3205; H01L 21/4763
[52] U.S. Cl. ..................... 438/585; 438/586; 438/592; 438/664; 438/719
[58] Field of Search ................... 438/158, 180, 438/364, 365, 366, 585, 586, 663, 664, 668, 669, 666, 706, 719, 721; 257/336, 344, 382

[56] References Cited

U.S. PATENT DOCUMENTS

| | | | |
|---|---|---|---|
| 5,686,331 | 11/1997 | Song | 437/41 |
| 5,753,557 | 5/1998 | Tseng | 438/651 |
| 5,801,424 | 9/1998 | Luich | 257/377 |
| 5,994,193 | 11/1999 | Gardner et al. | 438/586 |
| 6,015,747 | 1/2000 | Lopatin et al. | 438/586 |

*Primary Examiner*—Benjamin L. Utech
*Assistant Examiner*—Duy-Vu Deo
*Attorney, Agent, or Firm*—J. C. Patents; Jiawei Huang

[57] ABSTRACT

A method of forming the gate terminal of a device. The method includes forming spacers on top of the gate polysilicon layer and near the side edges thereof, and then etching the gate polysilicon layer to form a groove using the spacers as a mask. Hence, the exposed surface area of the gate polysilicon layer is increased. Finally, a metal silicide layer is formed over the gate polysilicon layer, producing a low resistance gate.

15 Claims, 2 Drawing Sheets

METHOD FOR FORMING GATE TERMINAL

CROSS-REFERENCE TO RELATED APPLICATION

This application claims the priority benefit of Taiwan application serial no. 88107124, filed May 3, 1999, the full disclosure of which is incorporated herein by reference.

BACKGROUND OF THE INVENTION

1. Field of Invention

The present invention relates to a method of manufacturing a semiconductor device. More particularly, the present invention relates to a method of forming the gate terminal of a device.

2. Description of Related Art

In the manufacturing of deep sub-micron circuits, line width, contact area and the junction depth of a device are all reduced because of the need for higher circuit capacity. In order to increase the reliability of devices and to decrease contact resistance so that RC delay is reduced, a metal silicide layer is usually formed on top of the conventional gate polysilicon layer. Since no photolithographic operation is required to form the silicide layer, the step of forming the metal silicide layer is also referred to as a self-aligned silicide (Salicide) process. At present, titanium silicide ($TiSi_x$) is the most widely used material for forming a self-aligned silicide layer because titanium silicide not only has a lower resistance but also can be more readily controlled in the manufacturing process.

However, as the line width of the polysilicon gate continues to shrink, a narrow-line line effect becomes dominant. The narrow-line effect is generally used to describe the exceptional contact stress created between a metal silicide layer and its underlying polysilicon gate layer. The narrow-line effect also includes the increase in sheet resistance resulting from a smaller number of nucleation sites in the metal silicide layer due to a reduction in gate line width, thereby affecting the operational efficiency of the gate terminal.

In light of the foregoing, there is a need to provide an improved method of forming the gate of a device.

SUMMARY OF THE INVENTION

Accordingly, the purpose of the present invention is to provide a method of forming a gate having a larger surface area for forming a metal silicide layer such that the gate terminal has a lower contact resistance and a smaller narrow-line effect.

To achieve these and other advantages and in accordance with the purpose of the invention, as embodied and broadly described herein, the invention provides a method of forming the gate of a device. The method includes the steps of providing a substrate having a multi-layered stack thereon. The multi-layered stack comprises a gate oxide layer, a gate polysilicon layer and a cap layer. In addition, each sidewall of the stack has a first spacer and the substrate has a conductive region such as a source/drain region on each side of the stack. Next, a silicon oxide layer serving as a protective layer is formed over the conductive regions, and then the cap layer is removed. Thereafter, second spacers are formed on the on the sidewalls of the first spacers above the gate polysilicon layer. In the subsequent step, a portion of the gate polysilicon layer is removed using the second spacers as a mask. Ultimately, a groove is formed in the gate polysilicon layer so that the effective contact area of the gate terminal is increased. Afterwards, the second spacers and the silicon oxide layer are removed. Finally, a metal silicide layer is formed over the gate polysilicon layer and the conductive regions.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
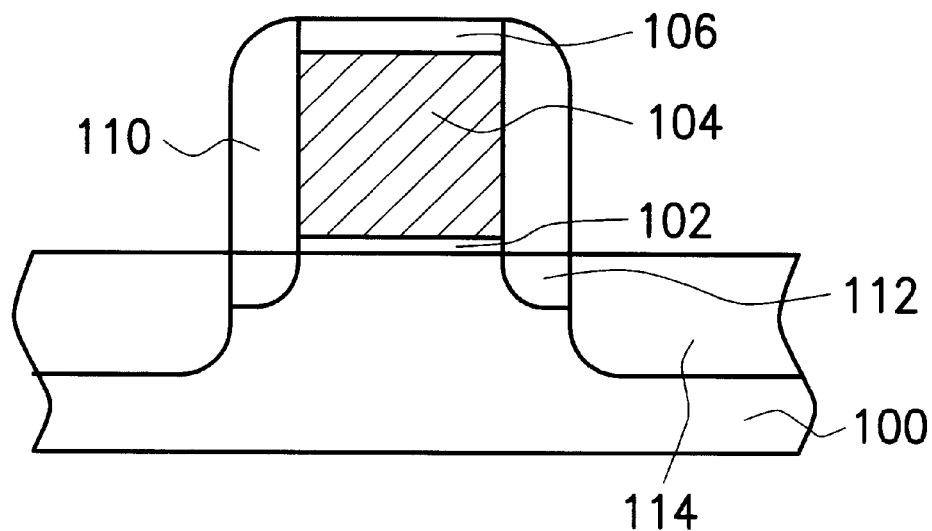
FIGS. 1A through 1D are cross-sectional views showing the progression of manufacturing steps for producing the gate structure according to the embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1D are cross-sectional views showing the progression of manufacturing steps in producing the gate structure according to the embodiment of this invention.

As shown in FIG. 1A, a substrate 100 is provided. After the active region is defined and shallow trench isolation (STI) structures for isolating devices are produced, a transistor is fabricated on the substrate 100. The transistor includes a multi-layered stack above the substrate 100, first spacers 110, which is a oxide spacer, on the sidewalls of the stack and a conductive region such as a source/drain region 114 in the substrate 100 on each side of the stack. The stack further includes, from bottom to top, a gate oxide layer 102, a gate polysilicon layer 104 and a cap layer 106.

In this embodiment, a conventional method of forming a transistor is illustrated. However, other methods of forming a transistor can be included as long as they are within the spirit and scope of this invention.

In general, the transistor is formed by sequentially forming a gate oxide layer 102, a gate polysilicon layer 104 and a cap layer 106 over a substrate 100 using, for example, chemical vapor deposition (CVD). To increase the electrical conductivity of the gate polysilicon layer 104, the gate polysilicon layer 104 can be a doped polysilicon layer. The cap layer 106 is preferably a silicon nitride layer.

Conventional photolithographic and etching processes are used to pattern the cap layer 106 and the polysilicon layer 104. Thereafter, an ion implantation operation is carried out, implanting ions into the substrate 100 to form lightly doped drain regions 112. Subsequently, first spacers 110 are formed on the sidewalls of the stack. The first spacers are formed, for example, by first depositing a silicon oxide layer over the substrate and the stack, and then etching back the silicon oxide layer. Another ion implant operation is then carried out to form heavily doped source/drain regions 114.

Figure 1B:
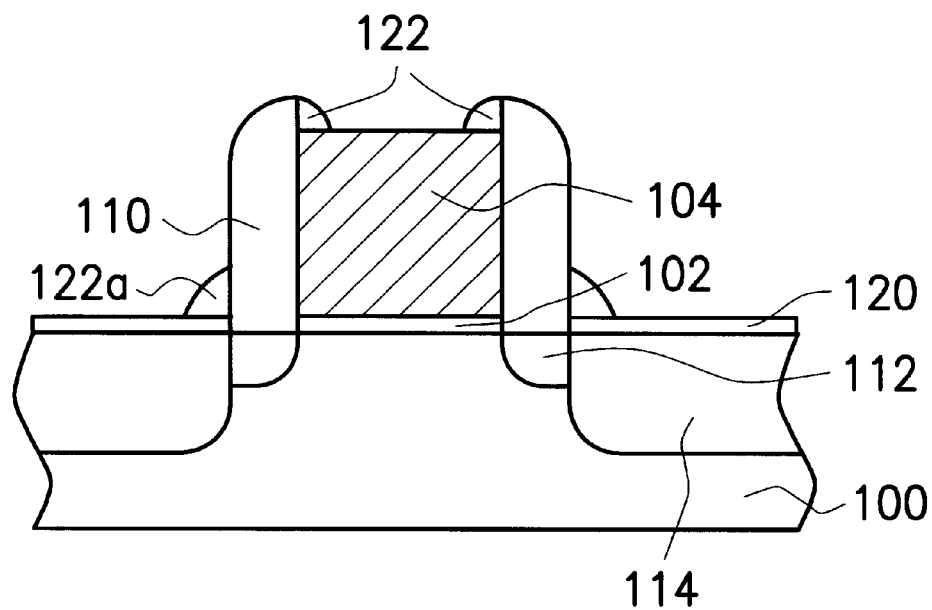

As shown in FIG. 1B, a thin silicon oxide layer 120 is formed over the source/drain regions 114 by performing a thermal oxidation operation. The silicon oxide layer 120 serves to protect the source/drain regions 114 against accidental damages resulting from subsequent etching operation. Thereafter, the cap layer 106 is removed using, for example, a wet etching operation.

Second spacers 122 (internal spacers) are formed on the interior sidewalls of the first spacers 110 above the gate polysilicon layer 104. The second spacers are formed by first depositing silicon nitride over the silicon oxide layer 120, the first spacers 110 and the gate polysilicon layer 104, and then etching back the silicon nitride layer. Width of the second spacers 122 can be carefully controlled to be within the desired range. For example, in the fabrication of circuits with a line width of about 0.18 $\mu$m, width of the second spacers 122 can be controlled to between about 300 Å to 500 Å. Although spacers 122a are also formed on the exterior sidewalls of the first spacers 110 at the same time as the spacers 120, the spacers 122a will be removed in a subsequent operation. Hence, the redundant spacers 122a will not interfere with the fabrication of the gate structure.

Figure 1C:
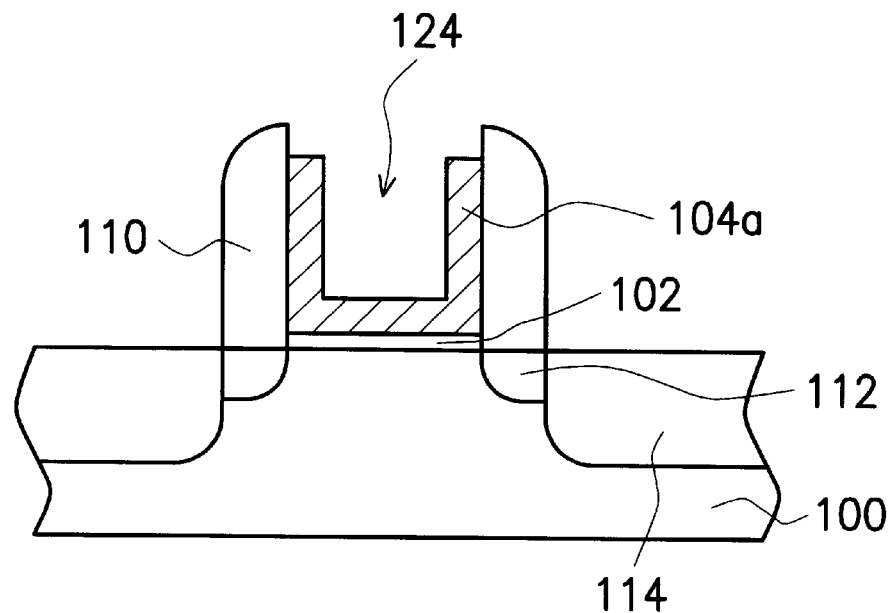

As shown in FIG. 1C, a portion of the gate polysilicon layer 104 is removed to form a groove 124 using the second spacers 122 as a mask. Therefore, a U-shaped gate 104a is formed. Suitable portions of the gate polysilicon layer 104 can be removed using a time-controlled anisotropic dry etching operation so that the polysilicon layer 104 is etched to a certain depth with a definite thickness above the gate oxide layer 102. By forming a U-shaped gate 104a, effective contact area of the gate terminal is increased and contact resistance is therefore lowered. Thereafter, the second spacers 122, exterior spacers 122a and the silicon oxide layer 120 are removed using wet etching, for example.

Figure 1D:
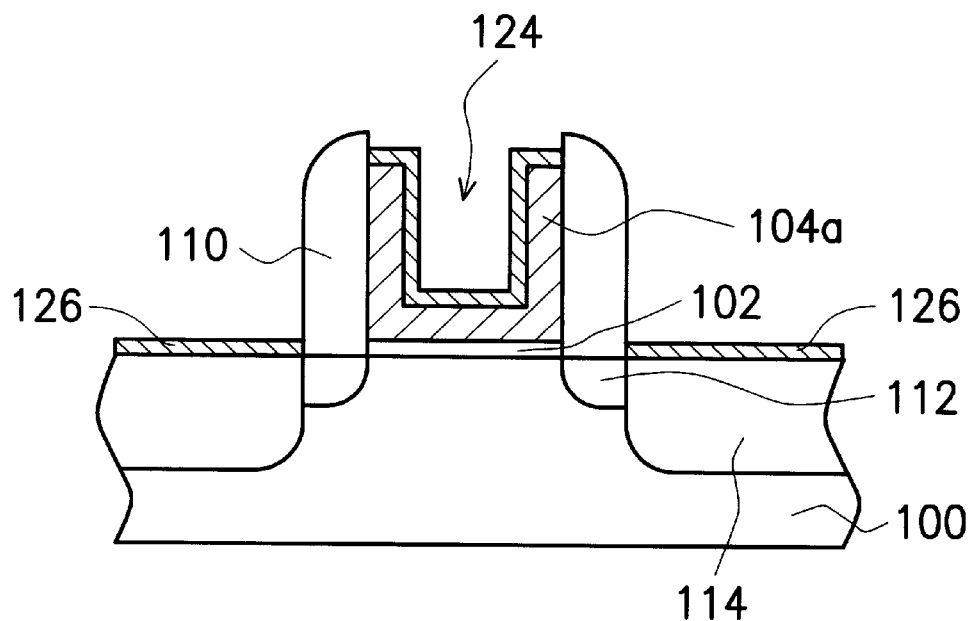

As shown in FIG. 1D, a self-aligned silicide process is carried out to form a metal silicide layer 126 over the gate 104a and the source/drain regions 114 so that contact resistance of the gate is further lowered. The silicide process includes sputtering metal such as titanium over the substrate 100 to form a titanium layer. Then, the substrate 100 is heated to about 700° C. in a nitrogen-filled (N$_2$) atmosphere to form titanium silicide layers between the titanium layer and the gate polysilicon layer 104a as well as the source/drain regions 114. Thereafter, a wet etching operation is conducted to remove the residual titanium layer. Finally, an annealing operation is carried out to strengthen the titanium silicide layer. It is also possible to substitute cobalt silicide for the titanium silicide layer in the fabrication of a silicide layer over the gate 104a and the source/drain regions 114.

In summary, the embodiment of this invention is capable of increasing the contact area of the gate terminal and reducing contact resistance. Therefore, problems caused by narrow-line effect can be avoided. Moreover, the method is relatively easy to implement, and hence has a high practical value.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming the gate of a device, comprising the steps of:

providing a substrate that has a multi-layered stack including a silicon oxide layer, a polysilicon layer, and a cap layer thereon, and first spacers on the sidewalls of the stack;

removing the cap layer;

forming second spacers on the sidewalls of the first spacers above the polysilicon layer;

removing a portion of the polysilicon layer to form a groove using the second spacers as a mask;

removing the second spacers; and forming a metal silicide layer over the polysilicon layer.

2. The method of claim 1, wherein the step of forming the second spacers includes depositing silicon nitride.

3. The method of claim 2, wherein the step of forming the second spacers includes the sub-steps of:

forming a silicon nitride layer over the substrate; and etching back the silicon nitride layer.

4. The method of claim 1, wherein the second spacer has a width of between about 300 Å to 500 Å.

5. The method of claim 1, wherein the step of removing a portion of the polysilicon layer includes dry etching.

6. The method of claim 1, wherein the step of forming the metal silicide layer includes reacting titanium with silicon to form a titanium silicide layer.

7. The method of claim 6, wherein the step of forming the titanium silicide layer includes the steps of:

forming a titanium layer over the polysilicon layer;

performing a silicide process to form a titanium silicide layer at the interface between the titanium layer and the polysilicon layer;

removing the residual titanium layer; and annealing the titanium silicide layer.

8. The method of claim 7, wherein the silicide process is carried out at a temperature of around 700° C.

9. The method of claim 7, wherein the silicide process is carried out in a nitrogen-filled atmosphere.

10. A method of forming transistor, comprising the steps of:

providing a substrate;

forming a patterned multi-layered stack over the substrate, wherein the multi-layered stack includes a first silicon oxide layer, a polysilicon layer and a cap layer;

forming first spacers on the sidewalls of the multi-layered stack;

forming a conductive region in the substrate on each side of the spacer-covered stack;

forming a second silicon oxide layer over the conductive regions;

removing the cap layer;

forming second spacers on the sidewalls of the first spacers above the polysilicon layer;

removing a portion of the polysilicon layer to form a groove using the second spacers as a mask;

removing the second spacers and the second silicon oxide layer; and forming a metal silicide layer over the polysilicon layer and the conductive regions.

11. The method of claim 10, wherein the step of forming the second spacers includes depositing silicon nitride.

12. The method of claim 10, wherein the second spacer has a width of between 300 Å to 500 Å.

13. A method of manufacturing a low contact resistant gate terminal for a transistor, comprising the steps of:

providing a substrate that has a multi-layered stack including a silicon oxide layer, a polysilicon layer and a cap layer thereon, and first spacers on the sidewalls of the multi-layered stack;

removing the cap layer;

forming second spacers on the sidewalls of the first spacers above the polysilicon layer;

removing a portion of the polysilicon layer to form a groove using the second spacers as a mask;

removing the second spacers; and forming a metal silicide layer over the polysilicon layer.

14. The method of claim 13, wherein the step of forming the second spacers includes depositing silicon nitride.

15. The method of claim 13, wherein the second spacer has a width of between about 300 Å to 500 Å.

* * * * *